(12) United States Patent
Lindström et al.

(10) Patent No.: US 10,998,459 B2
(45) Date of Patent: May 4, 2021

(54) LIGHT ABSORBING LAYER AND A PHOTOVOLTAIC DEVICE INCLUDING A LIGHT ABSORBING LAYER

(71) Applicant: Exeger Operations AB, Stockholm (SE)

(72) Inventors: Henrik Lindström, Åkersberga (SE); Giovanni Fili, Danderyd (SE)

(73) Assignee: Exeger Operations AB, Stockholm (SE)

( * ) Notice: Subject to any disclaimer, the term of this patent is extended or adjusted under 35 U.S.C. 154(b) by 0 days.

(21) Appl. No.: 16/321,547

(22) PCT Filed: Jan. 10, 2017

(86) PCT No.: PCT/SE2017/050016
§ 371 (c)(1),
(2) Date: Jan. 29, 2019

(87) PCT Pub. No.: WO2018/021952
PCT Pub. Date: Feb. 1, 2018

(65) Prior Publication Data
US 2019/0165290 A1    May 30, 2019

(30) Foreign Application Priority Data
Jul. 29, 2016  (SE) .................................... 1651090-1
Nov. 21, 2016 (SE) .................................... 1651521-5

(51) Int. Cl.
*H01L 31/028*  (2006.01)
*H01L 51/00*  (2006.01)
(Continued)

(52) U.S. Cl.
CPC ......... *H01L 31/028* (2013.01); *H01G 9/2009* (2013.01); *H01G 9/2045* (2013.01);
(Continued)

(58) Field of Classification Search
CPC . H01L 31/072; H01L 31/032; H01L 31/0384; H01L 31/03845; H01L 51/42; H01L 51/44
See application file for complete search history.

(56) References Cited

U.S. PATENT DOCUMENTS 4,357,400 A   11/1982  Appleby
8,158,880 B1   4/2012  Girt et al.
(Continued)

FOREIGN PATENT DOCUMENTS

CN    104795464 A    7/2015
EP      1624472 A2   2/2006
(Continued)

OTHER PUBLICATIONS

Park etal, Charge transport properties for TiO2 networks with different particle size for dye sensitized solar cells, 2013, Applied Materials and Interfaces.*
(Continued)

*Primary Examiner* — Bethany L Martin
(74) *Attorney, Agent, or Firm* — Dilworth & Barrese, LLP

(57) ABSTRACT

The present invention relates to a light absorbing layer (1a) for a photovoltaic device, comprising a plurality of grains (2) of a doped semiconducting material and a charge conductor (3) made of a charge conducting material in physical contact with the grains. The grains are partly covered with the charge conductor (3) so that a plurality of junctions (4) are formed between the grains and the charge conductor. The present invention also relates to a photovoltaic device comprising the light absorbing layer (1a).

10 Claims, 4 Drawing Sheets

(51) Int. Cl.

| | | |
|---|---|---|
| *H01L 51/44* | (2006.01) | |
| *H01L 31/0352* | (2006.01) | |
| *H01L 51/42* | (2006.01) | |
| *H01L 31/032* | (2006.01) | |
| *H01L 31/0384* | (2006.01) | |
| *H01L 31/072* | (2012.01) | |
| *H01G 9/20* | (2006.01) | |
| *H01L 31/18* | (2006.01) | |

(52) U.S. Cl.
CPC ........ *H01L 31/032* (2013.01); *H01L 31/0384* (2013.01); *H01L 31/03529* (2013.01); *H01L 31/072* (2013.01); *H01L 31/182* (2013.01); *H01L 51/0037* (2013.01); *H01L 51/4213* (2013.01); *H01L 51/44* (2013.01); *Y02E 10/542* (2013.01); *Y02E 10/549* (2013.01)

(56) References Cited

U.S. PATENT DOCUMENTS

| | | |
|---|---|---|
| 9,252,319 B2 | 2/2016 | Loscutoff et al. |
| 2009/0159120 A1 | 6/2009 | Wang et al. |
| 2009/0308442 A1 | 12/2009 | Liu |
| 2010/0051097 A1* | 3/2010 | Kang ................. H01G 9/2031 136/256 |
| 2011/0000537 A1 | 1/2011 | Myong |
| 2011/0048525 A1 | 3/2011 | Yoneya et al. |
| 2012/0285521 A1 | 11/2012 | Huang et al. |
| 2013/0000703 A1 | 1/2013 | Lee et al. |
| 2013/0199613 A1 | 8/2013 | Hayakawa et al. |
| 2014/0166095 A1 | 6/2014 | Loscutoff et al. |
| 2015/0129034 A1 | 5/2015 | Snaith et al. |
| 2016/0351343 A1 | 12/2016 | Lindström et al. |

FOREIGN PATENT DOCUMENTS

| | | |
|---|---|---|
| EP | 2003700 A2 | 12/2008 |
| EP | 2922109 A1 | 9/2015 |
| JP | 2004087546 A | 3/2004 |
| JP | 2006-156582 A | 6/2006 |
| JP | 2006156582 A | 6/2006 |
| KR | 20130006954 A | 1/2013 |
| TW | 201432933 A | 8/2014 |
| TW | 201532295 A | 8/2015 |
| WO | 2011/030117 A1 | 3/2011 |
| WO | 2013/149787 A1 | 10/2013 |
| WO | 2013/171520 A1 | 11/2013 |
| WO | 2014/184379 A1 | 11/2014 |
| WO | 2015/031944 A1 | 3/2015 |
| WO | 2015/117795 A1 | 8/2015 |
| WO | 2016/110851 A1 | 7/2016 |

OTHER PUBLICATIONS

Tanvi et al, Efficiency enhancement in dye sensitized solar cells using dual function mesoporous silica as scatterer and back recombination inhibitor, 2016, Chemical Physical Letters, vol. 658.*

Chou et al, Titania Particle Size Effect on Overall Performance of Dye-Sensitized Solar Cells, 2007, The Journal of Phyical Chemistry, vol. 111 pp. 6296-6302.*

Chen et al., "Hybrid Solar Cells Based on P3HT and Si@mwcnt Nanocomposite," Nanotechnology 21 (34), 2010, pp. 1-10.

Pan et al., "Föster resonance energy transfer in solution-processed Si-nanoparticle/carbon nanotube nanocomposites," Nanotechnology 20, 2009, pp. 1-6.

Jäckle et al., "Junction formation and current transport mechanisms in hybrid n-Si/PEDOT:PSS solar cells," Scientific Reports 5, Aug. 17, 2015, pp. 1-12.

* cited by examiner

LIGHT ABSORBING LAYER AND A PHOTOVOLTAIC DEVICE INCLUDING A LIGHT ABSORBING LAYER

FIELD OF THE INVENTION

The present invention relates to the field of photovoltaic devices including light absorbing layers, such as solar cells. The present invention also relates to a light absorbing layer for photovoltaic devices.

BACKGROUND OF THE INVENTION

Photovoltaic devices provide conversion of light into electricity using semiconducting materials that exhibit a photovoltaic effect.

A typical photovoltaic system employs solar panels, each comprising a number of solar cells, which generate electrical power. A solar cell or photovoltaic device is a device which directly converts sunlight into electricity. Light incident on the surface of the solar cell produces electric power. A solar cell has a light absorbing layer. When the energy of a photon is equal to or greater than the band gap of the material in the light absorbing layer, the photon is absorbed by the material and a photo-excited electron is generated. The front surface is doped in another way than the base, creating a PN-junction. Under illumination, photons are absorbed, thereby creating an electron-hole pair that is separated in the PN-junction. On the backside of the solar cell a metal plate collects excess charge-carriers from the base, and on the front side metal wires collect excess charge-carriers from the emitter.

Silicon is the most commonly used semiconductor material in solar cells. Silicon has several advantages, for example, it is chemically stable, and provides a high efficiency due to its high ability to absorb light. Standard silicon solar cells are made from thin wafers of doped silicon. A disadvantage with silicon wafers is that they are expensive.

The front surface of the silicon wafer is doped in another way than the base, creating a PN-junction. During production of the solar cell, a number of samples of doped silicon wafers must be cut or sawed from a silicon ingot, and then the samples of silicon wafers are assembled electrically to a solar cell. Since the silicon ingot must have extremely high purity and since the sawing is time-consuming and creates significant amounts of waste material, the production of such solar cells is expensive.

On the backside of a traditional solar cell a metal plate collects excess charge-carriers from the base, and on the front side metal grids and metal wires collect excess charge-carriers from the emitter. Thus, conventional silicon solar cells have a front-side contacted emitter. A problem with using current collecting grids and wires on the front side of the solar cell is that there is a trade-off between good current collection and light harvesting. By increasing the size of the metal wires, the conduction is increased and the current collection is improved. However, by increasing the size of the metal grids and wires more of the sun harvesting area is shaded, leading to a reduced efficiency of the solar cell.

A known solution to this problem is rear contact solar cells. US 2014166095 A1 describes how to make a back contact back junction silicon solar cell. Rear contact solar cells achieve higher efficiency by moving the front-side contacted emitter to the rear side of the solar cell. The higher efficiency results from the reduced shading on the front side of the solar cell. There exist several configurations of rear contact solar cells. For example, in back-contacted back-junction (BC-BJ) silicon solar cells, the emitter area and all wiring are placed on the backside of the solar cell resulting in effective removal of any shadowing components from the front side of the solar cell. However, the production of these BC-BJ silicon solar cells is both complex and costly.

WO 2013/149787 A1 discloses a dye-sensitized solar cell having a rear contact. The solar cell includes a porous insulating layer, a working electrode including a porous conducting metal layer formed on top of the porous insulating layer, and a light absorbing layer containing an adsorbed dye arranged on top of the porous conducting metal layer to face the sun. The light absorbing layer comprises $TiO_2$ metal oxide particles dyed by light absorbing dye molecules on the surface of the $TiO_2$ particles. The dye-sensitized solar cell further includes a counter electrode including a conducting layer disposed on an opposite side of the porous insulating layer. An electrolyte is filled between the working electrode and the counter electrode. An advantage of this solar cell is that it is easy and fast to manufacture, and accordingly it is cost effective to produce. A disadvantage of this type of solar cell compared to a silicon solar cell is that its maximum efficiency is lower due to the fact that the dye molecules have less ability to absorb light than silicon.

In a further development of the dye-sensitized solar cells, the efficiency of the cells has been augmented by the use of perovskites as a substitute to the dye infused $TiO_2$ layer. WO2014/184379 discloses a dye-sensitized solar cell having light absorbing layer comprising a perovskite. An advantage of using a perovskite is that higher solar cell efficiencies can be reached. However, perovskite solar cells have several disadvantages, for example, they are difficult to manufacture, expensive, unstable and environmentally hazardous.

In order to reduce the cost of solar cells it has been proposed to use silicon grains instead of solid silicon wafers.

U.S. Pat. No. 4,357,400 discloses a solar cell with doped silicon particles in redox electrolyte. The solar cell includes an insulating substrate having two conducting layers interleaved on one side of the substrate. Discrete semiconductor particles of one type of doping are positioned on one of the conducting layers, and semiconducting particles of an opposite type of doping are positioned on the other conducting layer. All is immersed in a redox electrolyte and encapsulated. The redox electrolyte contacts the particles, whereby a voltage potential is generated across the two conducting layers in response to photons impinging on the semiconductor particles. The conducting layers are thin layers of, for example, aluminium. The conducting layers are sputtered and etched on a substrate in a pattern, for example, with interdigitated fingers. The semiconducting particles can be applied by silk screening and glued to the surface of the conductors. A disadvantage with this solar cell is that the manufacturing process is complicated and time-consuming. Thus, the solar cell is expensive to manufacture.

CN20151101264 describes a traditional solar cell with a silicon wafer and front and back contacts. In order to improve fill factor and conversion efficiency luminous porous silicon particles are spin coated onto the surface of the silicon wafer of the solar cell. The silicon grains are prepared by electrochemical etching in HF and ethanol solution and thereafter grinded to 2-200 nm particle sizes. A disadvantage with this type of solar cell is that the silicon grains are attached to a silicon wafer thereby creating a large and voluminous silicon structure US2011/0000537 describes a solar cell having a light absorbing layer including hydrogenated amorphous silicon, a non-silicon based element and crystalline silicon grains embedded in the hydrogenated amorphous silicon based material.

JP2004087546 describes a method of forming a silicon film by using a composition containing Si particles. The Si particles are formed by crushing silicon ingots and milling the parts to suitable size. The particles are washed to remove silicon oxide and mixed with a dispersion medium. After application of the composition onto a glass substrate, the substrate is heat-treated and a silicon film is obtained.

It is known to use organic materials to produce photovoltaic devices with the aim of reducing manufacturing costs. The organic material is in contact with an inorganic semiconducting material and by that a heterojunction is created in which electrons and holes are separated.

The use of hybrid inorganic-organic solar cells combining monocrystalline n-type silicon (n-Si) and a highly conductive polymer poly(3,4-ethylenedioxythiophene)-poly(styrene sulfonate) (PEDOT:PSS) is described in an article entitled "Junction formation and current transport mechanisms in hybrid n-Si/PEDOT:PSS solar cells" in Scientific reports published Aug. 17, 2015 and written by Sara Jackie, Matthias Mattiza, Martin Liebhaber, Gerald Brönstrup, Mathias Rommel, Klaus Lips, and Silke Christiansen. The article describes a n-type Si-wafer laminated to an In/Ga eutectic back contact and a PEDOT:PSS layer on top of the wafer together with an Au grid front contact.

US2012/0285521 describes a photovoltaic device in which an inorganic semiconducting layer is laminated with an organic layer and a metal anode grid is positioned on top of the organic layer and a cathode layer is positioned under the Si layer. For example, the semiconducting layer is, made of a silicon wafer and the organic layer is, for example, made of PEDOT:PSS. A disadvantage with this photovoltaic device is that the metal anode grid is positioned on top of the organic layer, and accordingly it shades a part of the sun harvesting area leading to a reduced efficiency of the solar cell.

OBJECT AND SUMMARY OF THE INVENTION

It is an object of the present invention to at least partly overcome the above mentioned problems and to provide an improved photovoltaic device.

According to a first aspect of the invention, this object is achieved by a light absorbing layer for a photovoltaic device as defined herein.

The light absorbing layer according to the invention comprises a plurality of grains of a doped semiconducting material, and a charge conductor made of a charge conducting material partly covering the grains so that a plurality of junctions are formed between the grains and the charge conductor.

The junctions are interfaces between the grains and the charge conductor capable of providing separation of photo-excited electrons and holes. The grains are in electrical and physical contact with the charge conductor to form the junctions. Depending on the type of semiconducting material and the charge conducting material, the junctions can be homojunctions, or heterojunctions.

A homojunction is an interface between similar semiconductor materials. These materials have equal band gaps but typically have different doping. For example, a homojunction occurs at the interface between an n-doped and p-doped semiconductor, a so called a PN junction.

A heterojunction is the interface between any two solid-state materials, including crystalline and amorphous structures of metallic, insulating, fast ion conductor and semi-conducting materials. The two solid-state materials can be made of a combination of two inorganic materials or a combination of two organic materials or a combination of one inorganic and one organic material.

The light absorbing layer according to the invention is cheap to produce, is environmentally friendly and has a high conversion efficiency.

A charge conductor as used herein is made of hole conducting material or an electron conducting material. In a hole conducting material, the majority charge carriers are holes, and in an electron conducting material the majority charge carriers are electrons. A hole conducting material is a material that mainly allows transport of holes and that mainly prevents transport of electrons. An electron conducting material is a material that mainly allows transport of electrons and that mainly prevents transport of holes.

An ideal charge conductor is capable of forming a junction together with the grain where the formed junction is capable of separating photo-generated electrons and holes. An ideal charge conductor accepts and conducts only one type of charge carrier and blocks the other type of charge carrier. For example, if the charge conductor is an ideal hole conductor the charge conductor conducts only holes, and blocks electrons from entering the hole conductor. If the charge conductor is an ideal electron conductor the charge conductor conducts only electrons, and will block holes from entering the electron conductor.

The charge conductor serves several purposes. A main purpose is to provide junctions where electrons and holes can be separated. A second purpose is to conduct away one type of charge carrier from the junction. A third purpose is to bind the grains mechanically to each other and to bind the grains mechanically to the first conducting layer to form a mechanically robust light absorbing layer.

The grains can be attached to a conducting substrate. Suitably the grains are attached to a conducting layer. Since part of the grain surface is in physical contact with the conducting substrate or the conducting layer, the charge conductor can only partly cover the entire surface area of the grain. The remaining free surface areas of the grains are preferably covered with the charge conductor so that a plurality of junctions are formed between the grains and the charge conductor.

The material of the light absorbing layer according to the invention is significantly cheaper than the light absorbing layer of traditional silicon solar cells, since it can be made of powder including semi-conductor grains instead of expensive wafers, and since the amount of semiconducting material needed is less than for traditional semiconductor solar cells. Suitably, the semiconducting material is silicon. However, other semiconducting material can also be used, such as CdTe, CIGS, CIS, GaAs, or perovskite.

The material of the light absorbing layer is also cheaper than a light absorbing layer of a dye sensitized solar cell, since a cheap semiconductor, such as silicon, can be used as a light absorber instead of more expensive dye molecules.

Due to the fact that the light absorbing layer comprises grains, which will show a multitude of angels towards the incident light, the efficiency of the photovoltaic device does not depend critically on the angle of incidence of the light with respect to the layer, as is the case with planar silicon wafers. Thus, the optical losses are reduced compared to a planar silicon wafer.

Due to the grains, the surface of the light absorbing layer becomes rougher compared to the case where wafers are used. As compared to a planar silicon wafer, the rougher surface of the grains increases the probability for reflected light to be absorbed, which reduces efficiency losses due to reflections in the surface. Thus, the need of an anti-reflection coating, often used on the surface of a traditional silicon solar cells, is reduced or is no longer necessary.

The light absorbing layer can be made by environmentally friendly materials. For example, the grains can be made of silicon, which is an environmentally friendly and stable material with high conversion efficiency. The charge conductor material can, for example, comprise an organic material, such as a polymer or be inorganic or metal-organic.

The light absorbing layer according to the invention is significantly easier to manufacture compared to traditional silicon light absorbing layers such as wafers or thin films. The light absorbing layer can, for example, be manufactured by depositing an ink comprising the grains onto a surface, for example, a conducting surface. The ink can be deposited in any suitable pattern on the surface. The charge conductor material is then deposited on the free surface of the grains.

Suitably, the charge conductor is disposed on the free surface of the grains, and in the empty space between the grains. Since the charge conducting material has a certain intrinsic mechanical stability, the charge conducting material acts as glue between the grains, thus stabilizing the light absorbing layer. Moreover, the charge conductor also glues together the grains and the first conducting layer and, thereby, improves the mechanical adhesion of the grains and the first conducting layer. This embodiment improves the physical strength of the light absorbing layer and the adhesion of the grains to the first conducting layer.

According to an embodiment of the invention, the charge conductor is disposed on the grains so that most of the grains are covered with a charge conducting layer covering a major part of the surface of the grain. A charge conducting layer is a layer made of a charge conducting material, as defined above The charge conductor is disposed on the grains so that the charge conductor thereby forms a plurality of charge conducting layers, each charge conducting layer covering the free surface of a single grain or several adjacent grains. If the charge conducting layer is too thick, the conducting layer will act as a light absorbing filter preventing some of the light from reaching the grain. Preferably, the charge conducting layer has a thickness between 10 nm and 200 nm. More preferably, the charge conducting layer has a thickness between 50 nm and 100 nm, and even more preferably between 70 nm and 90 nm. Such thin layers will allow most of the light to penetrate through the charge conducting layer and reach the grains.

Preferably, the entire free surface of a grain, i.e. the surface not in contact with the substrate/conducting layer, will be covered by the charge conductor. The coverage of charge conductor of the free surface may include minor disruptions in the coverage due to variations in process parameters or charge conductor material properties. The coverage may also be disrupted due to the geometries of the grains preventing full coverage of the free surface. The charge conductor may also include small grains/particles, and the spaces between the grains/particles may cause disruptions in the coverage of the grains. The disruptions in coverage will reduce the efficiency of the cell.

According to an embodiment of the invention, each of the grains has an upper surface facing the light and the upper surface is covered with the charge conductor. Preferably, the layer of grains covers most of the surface of the substrate. The distribution of the grains on the substrate may lead to thin gaps between the grains, or overlapping of adjacent grains.

The charge conductor covers at least 50%, and more preferably at least 70%, of the surface of the grains, and most preferably at least 80% of the surface of the grains. The larger areas of the grains that are covered by the hole-conductor, the higher is the conversion efficiency, i.e. a larger part of the incident light is converted to electricity. Ideally, the charge conductor covers the entire free available surface of each grain.

The average size of the grains is suitably between 1 μm and 300 μm. Preferably, the average size of the grains is between 10 μm and 80 μm, and most preferably the average size of the grains is between 20-50 μm. The thickness of the light absorbing layer depends on the size of the grains. A silicon wafer is typically about 150-200 μm. The light absorbing layer according to the invention can be made thinner and more flexible than the light absorbing layer of a traditional semiconductor solar cell. The light absorbing layer according to the invention can, for example, be made about 40-80 μm, if grains of a size between 20-50 μm is used. If the grains are too small, their ability to absorb light is reduced. Too large grains may lose in efficiency due to the distance to the grain/charge conductor interfaces.

According to an embodiment of the invention, the grains are made of doped silicon. Silicon is a suitable material to be used in photovoltaic devices, since it is cheap, stable and has a high ability to absorb light, which leads to high efficiency of the light absorbing layer. The silicon can be a crystalline, pure, solar grade type with a low degree of impurities or polycrystal grains. The silicon can be N-type doped with a high doping concentration or p-type doped.

According to an embodiment of the invention, the grains predominantly have {111} planes exposed at the surface of the grains. The charge conductor is in contact with the {111} pyramidal planes of the grains. This embodiment causes light trapping, which means that the light is reflected several times in the surfaces, and by that the light absorption of the grains is increased.

According to an embodiment of the invention, the charge conductor is a conducting polymer. Suitably, the charge conductor is poly (3,4-ethylenedioxythiophene)-poly (styrene sulfonate) called PEDOT:PSS. PEDOT:PSS is a highly conductive hole conducting polymer. The charge conductor can also be made of an inorganic material, or a metal-organic material.

According to an embodiment of the invention, the charge conductor is made of PEDOT:PSS and the grains are made of doped silicon. The doped silicon can be p-doped or n-doped. However, n-doped silicon is to be preferred together with PEDOT, since PEDOT is a hole conductor. PEDOT:PSS works well together with silicon and together they can achieve a high light-to-electric energy conversion efficiency.

According to an embodiment of the invention, the charge conductor material comprises inorganic materials or metal-organic materials.

According to an embodiment of the invention, the charge conductor comprises particles made of a semiconducting material of a different type of doping than the grains. Thus, a plurality of junctions, where photo-excited electrons and holes are separated, is formed in the interfaces between the grains and the particles. For example, the junctions are PN-junctions.

According to a second aspect of the invention, this object is achieved by a photovoltaic device as defined in claim 12.

The photovoltaic device comprises a light absorbing layer in accordance with above description, including a plurality of grains of a doped semiconducting material, and a charge conductor partly covering the grains so that a plurality of junctions is formed between the grains and the charge conductor.

A photovoltaic device according to the invention has the same advantages as mentioned above for the light absorbing layer. Accordingly, the production costs are reduced for the photovoltaic device, and the maximum efficiency of the photovoltaic device is increased due to less optical and reflection losses and the need for anti-reflection coating is reduced or it is no longer necessary. The photovoltaic device according to the invention is easy to manufacture and can be made thin and flexible.

The photovoltaic device according to the invention comprises a light absorbing layer comprising grains of a semiconducting material. Grains have several advantages over wafers or deposited thin films in that grains are cheaper, easier to handle, easier to apply and a layer with grains is more flexible. In a solar cell with a light absorbing layer comprising grains each grain will act as a "mini" solar cell. A grain has a large surface area in relation to its volume, allowing a large area of contact between the charge carrying material and the semiconductor. The size of the grains can be optimized for sun light to electrical energy conversion efficiency. It is therefore also possible to use less semiconductor material when designing the photovoltaic device. The grains also pose semiconductor surfaces in various directions thus reducing the dependence on angle of light incidence leading to less optical and reflection losses.

According to an embodiment of the invention, the device comprises a first conducting layer, and the light absorbing layer is disposed on the first conducting layer so that the grains are in electrical and physical contact with the first conducting layer. The first conducting layer collects the photo-excited electrons from the junctions and transports the electrons to an external circuit outside the photovoltaic device. Due to the fact that the grains are in direct physical and electrical contact with the first conducting layer, the distance the electrons have to travel before they are collected is short, and accordingly the probability for the electrons and holes to recombine before they are collected is low. Thus, an advantage with a photovoltaic device according to this embodiment of the invention, compared to a traditional photovoltaic, is that the electrical resistive losses in the light absorbing layer are less, due to the shorter distance for the electrons to travel before they are collected. The distance for charge carriers to be collected by the first conducting layer according to this embodiment ranges typically from a few micrometres to tens of micrometres, whereas in a traditional silicon wafer solar cell the electrons typically need to travel several thousands of micrometres, i.e. several millimetres, to reach the front side current collector or several hundred micrometres to reach the back side current collector.

The grains can be deposited directly onto the first conducting layer, for extracting charge carriers, like electrons or holes. The deposition of the grains can be made with simple processes like printing or the like. On top of the grains, a charge conductor made of a charge conducting material for carrying holes or electrons is applied for forming the light absorption layer. According to an embodiment of the invention, the charge conductor is a conducting polymer. A polymer has the ability to act as a glue between the grains and by that improve the mechanical stability of the light absorbing layer. Moreover, the conducting polymer also glues together the grains and the first conducting layer and thereby improves the mechanical adhesion of the grains and the first conducting layer.

According to an embodiment of the invention, a portion of the surface of each of the grains is in physical and electrical contact with the first conducting layer, and the predominant part of the remaining free surface of each of the grains is covered with the charge conductor. Each of the grains has an upper part covered with the charge conductor, and a lower part in physical and electrical contact with the first conducting layer. It is important that the lower part of the grains, which is in electrical contact with the first conducting layer, does not form a low ohmic junction with the charge conductor, in order to avoid electrical short circuit. If the electrical resistance between the charge conductor and the lower part of the grain is too low, then the losses due too short circuit will be too high. Thus, the parts of the surfaces of the grains, which are in electrical contact with the first conducting layer, should not be covered with the charge conductor. Preferably, the remaining surface of the grain is covered with the charge conductor to achieve a high conversion efficiency. Ideally, the charge conductor covers the entire remaining free surface of the grains.

According to an embodiment of the invention, the device comprises a second conducting layer electrically insulated from the first conducting layer. The charge conductor is electrically coupled to the second conducting layer and electrically insulated from the first conducting layer. The charge conductor can be directly or indirectly electrically connected to the second conducting layer. Preferably, the photovoltaic device comprises an insulating layer disposed between the first and second conducting layers to electrically insulate the first and second conducting layers, and the first and second conducting layers are arranged on opposite sides of the insulating layer. The light absorbing layer is disposed on the first conducting layer. Thus, the first conducting layer, the second conducting layer, and insulating layer are placed on the rear side of the light absorbing layer. An advantage with this embodiment, is that it has a back contact. Instead of using current collecting grids and wires on the front side of the light absorbing layer, which is facing the sun, first and second conducting layers are arranged on a rear side of the light absorbing layer. Thus, there is no shading of the light absorbing layer and increased efficiency is achieved. Another advantage with this embodiment is that the first conducting layer is arranged between the insulating layer and the light absorbing layer. Thus, the conducting layers of the device do not have to be transparent, and can be made of a material of high conductivity, which increases the current-handling capability and ensures high efficiency of the device. According to an embodiment of the invention, a first contact is electrically coupled to the first conducting layer, and a second contact electrically is coupled to the second conducting layer. Thus, the first contact is electrically coupled to the doped semiconducting material of the light absorbing layer, and the second contact is electrically coupled to the charge conductor. The first and second contacts can be disposed on the edges of the device, instead of on a front side. Thus, there is no shading of the light absorbing layer and increased efficiency is achieved.

The first and second conducting layers of the photovoltaic device can be connected to an external circuit and can be formed on either side of an insulating layer, and can be placed on the rear side of the light absorbing layer. The first conducting layer and the insulating layer can be made porous to the extent that the charge carrying material can penetrate through the structure and be connected with the second conducting layer. In order to exclude short-circuits and recombination of holes and electrons, the first conducting layer should be isolated from the charge conducting material. The grains are indirectly electrically connected to the second conducting layer via the charge conductor, and possibly via other layers of the device. Thus each grain in the light absorption layer is directly or indirectly connected to the first and second conducting layers and forms a photovoltaic electrical circuit.

According to an embodiment of the invention, the first conducting layer comprises a metal, and a zone of physical contact between the grains and the first conducting layer consists of a metal silicide, for example TiSi2, or a metal-silicon alloy, for example Al—Si alloy. The alloy or the silicide is formed in the boundaries between the grains and the first conducting layer during manufacturing of the photovoltaic device. Metal-silicon alloys or metal silicides have good electrical conducting properties. Due to the fact that the zone of physical contact, i.e. the boundaries between the grains and the first conducting layer, comprises metal-silicon alloy or metal silicide, the electrical contact between the grains and the conducting layer is improved. Therefore, the efficiency of the photovoltaic device is increased. For example, if the grains are made of silicon, and the first conducting layer comprises titanium, then the zone of physical contact between grains and the first conducting layer comprises titanium silicide after manufacturing of the photovoltaic device. If the conducting layer includes aluminium, then aluminium silicon alloy is formed in the boundaries between the grains and the first conducting layer during manufacturing of the photovoltaic device. Aluminium silicon alloy also has good electrical conducting properties. Also other metal than titanium or aluminium can be used in the first conducting layer.

Titanium silicide can exist in several variations, for example, $TiSi_2$, TiSi, $Ti_5Si_4$, $Ti_5Si_3$, $Ti_3Si$. According to an embodiment of the invention, the boundaries between the grains and the first conducting layer comprise $TiSi_2$. $TiSi_2$ exists in two variations: $C49-TiSi_2$ and $C54-TiSi_2$.

According to an embodiment of the invention, the charge conductor is deposited in such a way that it forms a plurality of continuous paths of charge conducting material from the surface of the grains to the second conducting layer. The charge conductor penetrates through the first conducting layer and the insulating layer to form the paths. The charge conductor form continuous paths of charge conducting material all the way from the surface of the grains down to the second conducting layer to allow holes/electrons generated at the junctions to travel to the second conducting layer and to recombine with electrons at the second conducting layer. The charge conductor electrically connects the layers of charge conductor on the grains with the second contact electrically coupled to the second conducting layer.

According to an embodiment of the invention, the first conducting layer is porous and the charge conductor extends through the first conducting layer.

According to an embodiment of the invention, the insulating layer between the first conducting layer and a second conducting layer is porous and the charge conductor extends through the insulating layer. The insulating layer may comprise a porous insulating substrate. For example, the porous insulating substrate is made of a glass microfiber or a ceramic microfiber.

According to an embodiment of the invention, the first conducting layer and the insulating layer are porous, the charge conductor is accommodated in pores of the first conducting layer, and in pores of the porous insulating layer so that a charge conducting path is formed between the light absorbing layer and the second contact. A charge conducting path is a path made of a charge conducting material, as defined above, and which path allows transport of charges, i.e. electrons or holes.

According to an embodiment of the invention, the first conducting layer comprises an insulating oxide arranged to electrically insulate the charge conductor from the first conducting layer.

According to an embodiment of the invention, the first conducting layer comprises conducting particles in electrical and mechanical contact with the grains. The conducting particles are in physical and electrical contact with each other. The grains are bonded to the conducting particles. Suitably, the grains are made of silicon, the conducting particles comprise metal, and the boundaries between the particles and the grains comprise metal silicon alloy or metal silicide. Thus, the electrical contact between the grains and the particles is improved.

According to an embodiment of the invention, the metal particles are at least partly covered with an insulating oxide. The parts of the surfaces of the metal particles, which are not in contact with the grains, are preferably covered with oxide. The oxide provides a protective and electrically insulating layer on the particles, which prevents that electrons or holes are transferred between the conducting layer and the charge conductor, and thereby prevents short circuit between the conducting layer and the charge conductor.

According to an embodiment of the invention, the metal particles are made of titanium or an alloy thereof. Titanium is a suitable material to be used in the conducting layer due to its ability to withstand corrosion and because it can form a good electrical contact to silicon. Preferably, at least a part of the surfaces of the metal particles is covered with titanium silicide. Titanium silicide has good electrical conducting properties. Due to the fact that the boundaries between the grains and the first conducting layer comprise titanium silicide, the electrical contact between the grains and the conducting layer is improved. Titanium silicide is formed in the boundaries between the grains and the first conducting layer during manufacturing of the photovoltaic device. Suitably, the metal particles comprise titanium, and the parts of the surfaces of the metal particles, which are not in contact with the grains, are covered with titanium oxide. The titanium oxide provides a protective oxide layer on the titanium particles, which prevents short circuit between the first conducting layer and the charge conductor.

According to an embodiment of the invention, the metal particles are made of aluminium or an alloy thereof. Suitably, the metal particles comprise aluminium, and the parts of the surfaces of the metal particles, which are not in contact with the grains, are covered with oxide such as aluminium oxide. The surface layer of oxide must be thick enough to prevent short circuit between the charge conductor and the aluminium.

According to an embodiment of the invention, the second connector comprises a low resistance connection site electrically connected to the charge conductor and to the second conducting layer, and electrically insulated from the first conducting layers. The connection site is positioned at the interface between the second conducting layer and the charge conductor. The connection site provides a low resistance path for electrons and holes across the junction between second connector and the charge conductor.

According to an embodiment of the invention, the connection site is made of silver.

According to an embodiment of the invention, the second conducting layer is porous, and the charge conductor penetrates through the second conducting layer. Suitably, the second conducting layer comprises metal particles.

According to an embodiment of the invention, the metal particles of the second conducting layer are made of titanium or an alloy thereof.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 1:
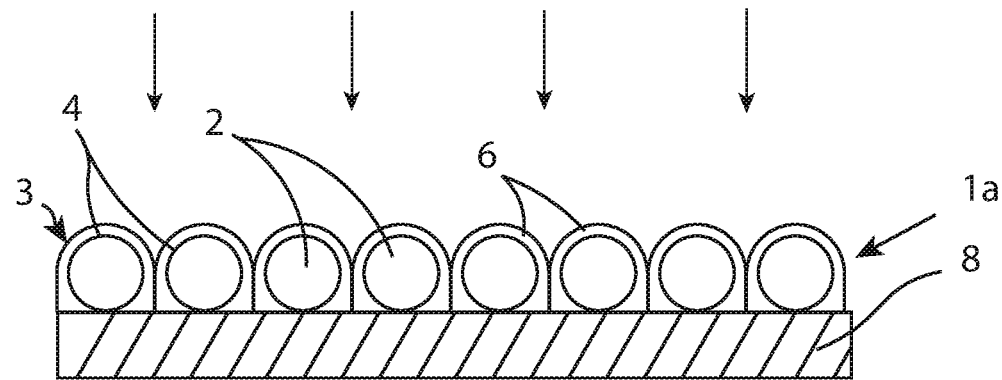
FIG. 1 shows an example of a light absorbing layer according to a first embodiment of the invention.

FIG. 1 shows a schematic drawing of a light absorbing layer 1a according to the invention. The light absorbing layer 1a comprises a plurality of grains 2 made of a doped semiconducting material, and an electric charge conductor 3 in physical and electrical contact with the grains 2. A junction 4 is formed in the contact area between the charge conductor 3 and the grains 2. The grains 2 are partly covered with the charge conductor 3 so that a plurality of junctions 4 are formed between the grains and the charge conductor. Preferably, at least 50% of the surface of the grains 2 is covered with the charge conductor.

The semiconducting material of the grains 2 has the ability to absorb photons, which excite electrons from a valence band to a conduction band and by that create electron-hole pairs in the semiconducting material. Suitably, the semiconducting material is silicon. However, other semiconducting material can also be used, such as CdTe, CIGS, CIS, GaAs, or perovskite. Preferably, the average size of the grains is between 1 µm and 300 µm, and typically, the average size of the grains 2 is between 20 µm and 100 µm.

The charge conductor 3 is made of a solid material, i.e. not liquid, and can be a hole conductor or an electron conductor. If the grains are n-doped, the charge conductor 3 preferably is a hole conductor, and if the grains are p-doped, the charge conductor 3 preferably is an electron conductor. The charge conductor 3 is made of a charge conducting material, for example, a doped semiconducting material, such as silicon, or an organic conducting material, such as a conducting polymer. Several transparent, conductive polymers with sufficient conductivity may be used for this purpose. An example of a suitable hole conducting polymer to be used in combination with silicon grains is poly (3,4-ethylenedioxythiophene) polystyrene sulfonate (PEDOT:PSS). PEDOT: PSS is a polymer mixture of two ionomers. Other examples of suitable material for the charge conductor 3 are polyaniline, P3HT and Spiro-OMeTAD. If a polymer conductor is used, the charge conductor comprises a plurality of particles made of a polymer or mixtures of polymers. The particles of the charge conductor partly cover the surface of the grains. The junctions 4 have the ability to provide separation of the pairs of photo-excited electrons and holes. Depending on the materials of the grains and the charge conductor, the junctions are homojunctions, such as p-n-junctions, or heterojunctions.

The grains 2 are essentially evenly distributed in the light absorbing layer, and the charge conductor 3 is located on the grains and in the space between the grains. The size and shape of the grains 2 may vary. The light absorbing layer 1a is applied to a layer 8. For example, the layer 8 is a conducting layer. The grains 2 are in physical as well as electrical contact with the layer 8. A lower portion of the grains may be protruding into the layer 8.

Figure 3:
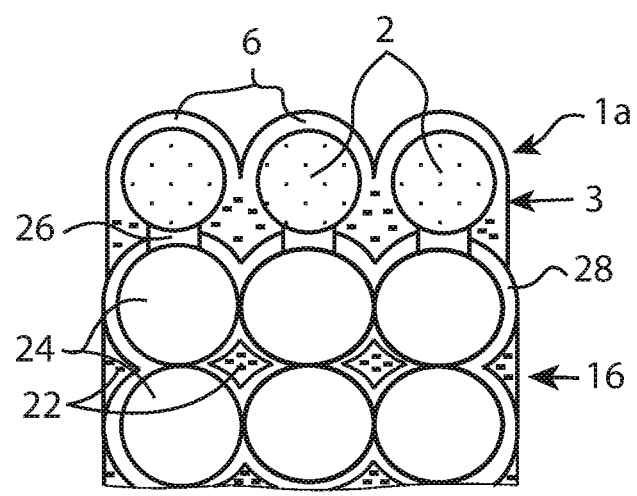
FIG. 3 shows an enlarged view of a part of the photovoltaic device shown in FIG. 2.

In the example shown in FIG. 3, the charge conductor 3 is an organic conductor. The charge conductor is disposed on the surfaces of the grains 2 so that a plurality of charge conducting layers 6 is formed on the grains. Thus, the surface of each of the grains 2 is partly covered with a charge conducting layer 6. Preferably, the charge conducting layers 6 have a thickness between 10 nm and 200 nm. Typically, the charge conducting layers 6 have a thickness between 50 nm and 100 nm. The charge conductor 3 is disposed between the grains so that the grains are bonded to each other by means of the organic charge conductor. Thus, the charge conductor increases the mechanical strength of the light absorbing layer. Each of the grains has an upper surface facing the incident light and a lower surface facing away from the incident light. In this embodiment, the upper surface of the grains is wholly or at least partly covered with the charge conductor 3, and the lower surface is free from charge conductor to enable electrical contact with a conducting layer 8, which is not a part of the light absorbing layer.

Figure 2:
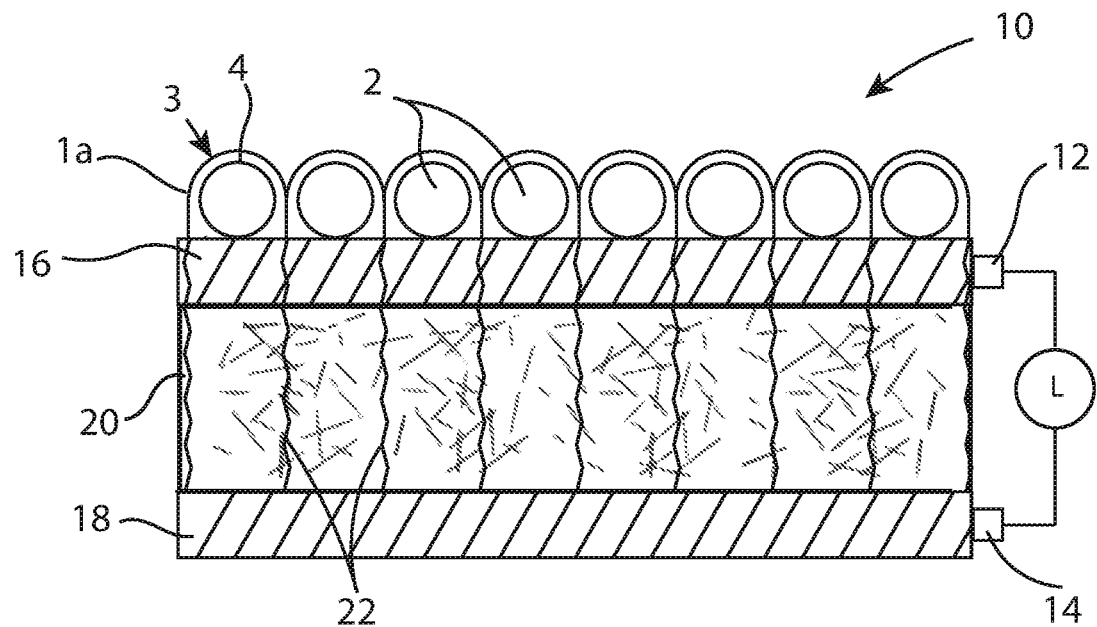
FIG. 2 shows schematically a cross-section though a photovoltaic device according to a first embodiment of the invention.

FIG. 2 shows schematically a cross-section though a photovoltaic device 10 according to a first embodiment of the invention. In this embodiment, the photovoltaic device 10 is a solar cell. FIG. 3 shows an enlarged view of a part of the photovoltaic device 10. The photovoltaic device 10 comprises the light absorbing layer 1a including the grains 2 and the charge conductor 3 as shown in FIG. 1, a first conducting layer 16 in electrical contact with the grains 2 of the light absorbing layer 1a, a second conducting layer 18 electrically coupled to the charge conductor 3, and an insulating layer 20 disposed between the first and second conducting layers 16, 18, to electrically insulate the first and second conducting layers. The light absorbing layer 1a is positioned on a top side of the photovoltaic device. The top side should be facing the sun to allow the sunlight to hit the grains 2 and generate photo-excited electrons. The first conducting layer 16 serves as a back contact that extracts photo-generated electrons from the light absorbing layer 1a. The light absorbing layer 1a is disposed on the first conducting layer. Thus, the distance the excited electrons and/or holes need to travel until they are collected is short. A first contact 12 is electrically connected to the first conducting layer 16, and a second contact 14 electrically connected to the second conducting layer 18. A load L is connected between the contacts 12, 14. The first and second conducting layers 16, 18 are suitably metal layers made of metal or metal alloy, for example, titanium, or aluminium or an alloy thereof.

The device 10 further comprises a plurality of charge conducting paths 22 of a charge conducting material disposed between the light absorbing layer 1a and the second conducting layer 18 to enable charges, i.e. holes or electrons, to travel from the light absorbing layer 1a to the second conducting layer 18. The conducting paths 22 are suitably, but not necessarily, made of the same material as the charge conducting layers 6 on the grains. In this embodiment, the charge conductor 3 forms the layers 6 on the grains as well as the conducting paths 22. The conducting paths 22 penetrate through the first conducting layer 16 and the insulating layer 20. Suitably, the first and second conducting layers 16, 18, and the insulating layer 20 are porous to allow the charge conductor to penetrate through the conducting layers and the insulating layer 20 to form the paths 22. The charge conductor 3 can be accommodated in pores of the first and second conducting layers 16, 18, and in pores of the insulating layer 20.

The insulating layer 20 may comprise a porous insulating substrate. For example, the porous insulating substrate is made of a glass microfiber or a ceramic microfiber. The first conducting layer 16 is disposed on an upper side of the porous insulating substrate, and the second conducting layer 18 is disposed on a lower side of the porous insulating substrate. The light absorbing layer 1a is disposed on the first conducting layer 16.

FIG. 3 shows an enlarged part of the light absorbing layer 1a and the first conducting layer 16. In this embodiment, the first conducting layer 16 comprises a plurality of conducting particles 24 made of a conducting material. The conducting particles 24 are suitably metal particles made of metal or metal alloy, for example, titanium or aluminium or an alloy thereof. The conductive particles 24 of the first conducting layer are in physical and electrical contact with each other. The grains 2 are in physical and electrical contact with some of the conducting particles 24 of the first conducting layer. Preferably, the grains 2 have a size less than 100 µm in order to provide a sufficient contact area between the grains and the particles 24 of first conducting layer 16. The grains 2 have an upper portion facing away from the photovoltaic device and a lower portion in physical contact with the conducting particles 24 of the first conducting layer. The upper portions of the grains 2 are covered with the conducting layers 6 of the charge conductor 3.

The grains are preferably made of doped silicon, and a zone of physical contact between the silicon grains 2 and the conducting particles 24 of the first conducting layer consists of a layer 26 of metal-silicon alloy or metal silicide in order to provide good electrical contact between the grains 2 and the particles 24. For example, the grains 2 are made of silicon (Si) and the conducting particles 24 are made of titanium (Ti), or at least partly comprise titanium, and the boundaries between the grains 2 and the particles 24 comprise a layer 26 of titanium silicide, which provides good electrical contact between Si and Ti.

Due to the fact that the first conducting layer 16 is formed by a plurality of conducting particles 24 bonded to each other, cavities are formed between the particles. Thus, the first conducting layer 16 allows the charge conductor 3 to extend through the first conducting layer to form the plurality of charge conducting paths 22. The charge conductor 3 is accommodated in some of the cavities formed between the conducting particles 24 in the first conducting layer 16.

In order to avoid electrical contact between the first conducting layer 16 and the conducting paths 22 of the charge conductor 3, the conducting particles 24 are at least partly covered with an insulating layer 28 of an insulating material, for example, an insulating oxide. Preferably, the parts of the surfaces of the conducting particles 24, which are not in contact with the grains 2 or with the other conducting particles 24 in the layer, are covered with the insulating layer 28. The charge conducting paths 22 of the charge conductor 3 are in contact with the insulating layers 28 on the particles 24, as shown in FIG. 3. A layer of insulating metal oxide is, for example, formed by oxidizing the conducting particles 24 during manufacturing of the device 10. The insulating layer 28 of metal oxide provides a protective and electrically insulating layer on the particles, which prevents that charges are transferred between the first conducting layer 16 and the charge conductor 3, and thereby prevents short circuit between the first conducting layer 16 and the charge conductor 3. For example, if the conducting particles comprise titanium, the parts of the surfaces of the titan particles, which are not in contact with the grains, are covered with titanium oxide ($TiO_2$). For example, if the conducting particles comprise aluminium, the parts of the surfaces of the conducting particles, which are not in contact with the grains, are covered with aluminium oxide ($Al_2O_3$).

The second conducting layer 18 may also comprise conducting particles. The conducting particles of the second conducting layer 18 are suitably metal particles made of metal or metal alloy, for example, titanium, aluminium, or an alloy thereof. In this example, the conducting particles (not shown) of the second conducting layer 18 are made of aluminium, and the aluminium particles are not covered with any insulating layer, and accordingly, the charge conductor is allowed to be in electrical contact with the particles of the second conducting layer 18. The conducting particles of the conducting layers 16, 18 are sintered to form the conducting layers. The conducting particles in each of the conducting layers 16, 18 are in electrical contact with each other to form a conducting layer. However, there is also space between the conducting particles to accommodate the charge conductor 3. The junctions 4 on the grains 2 of the light absorbing layer are in electrical contact with the paths 22 of charge conducting material, which are in electrical contact with conducting particles in the second conducting layer 18.

Figure 4:
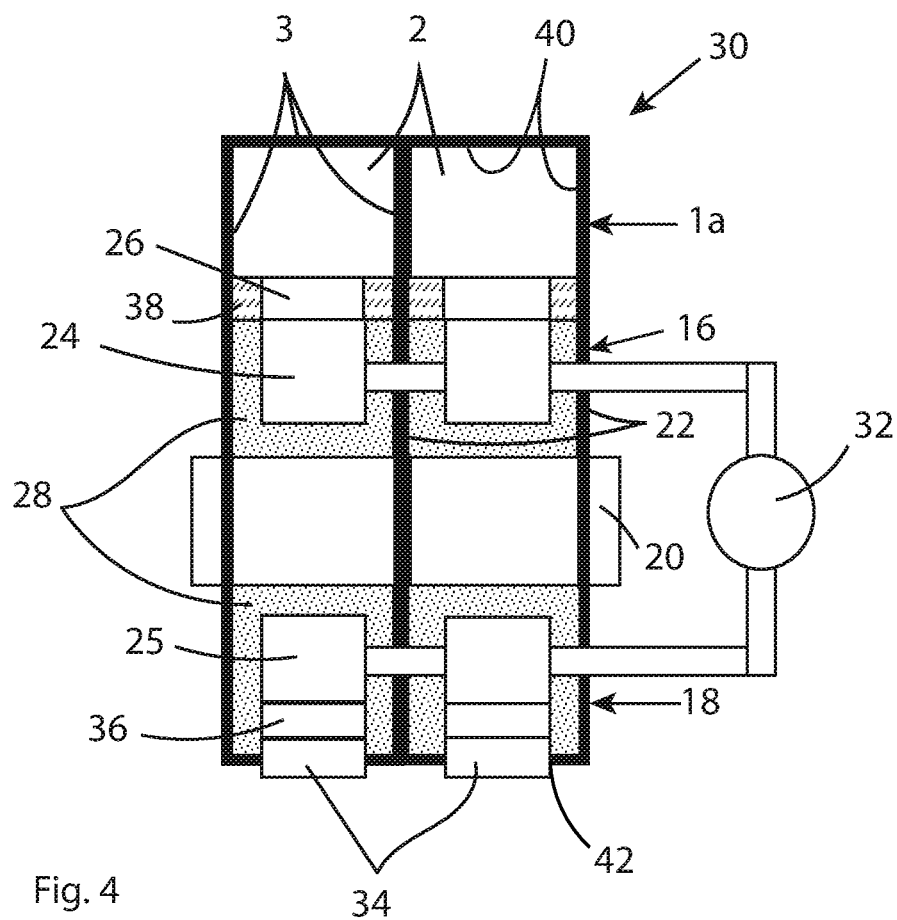
FIG. 4 shows schematically a cross-section though a photovoltaic device according to a second embodiment of the invention.

FIG. 4 shows schematically a cross-section though a part of a photovoltaic device 30 according to a second embodiment of the invention. The photovoltaic device 30 is a solar cell. In FIG. 4 the same and corresponding parts are designated by the same reference numerals as in FIGS. 1-3. FIG. 4 is a very simplified schematic view of the architecture of the device. In this example, the grains 2 are made of n-doped silicon, the first and second conducting layers include conducting particles 24, 25 made of titanium, and the charge conductor 3 is a hole conducting polymer. In this example the hole conducting polymer is PEDOT:PSS, in the following denoted PEDOT. PEDOT is a hole conductor and transports holes to the second conducting layer 18. The n-doped silicon grains are electron conductors and transport electrons to the first conducting layer. The first conducting layer then transports the electrons to the second conducting layer via an external electrical circuit. The grains 2 are, for example, made of crystalline silicon. The silicon grains may have predominantly {111} planes exposed at the surface. Instead of showing many silicon grains 2 and many titanium conducting particles 24, 25, only two silicon grains 2 and two titanium conducting particles 24, 25 in each of the conducting layers 16, 18, are shown. It is to be understood that the real solar cell contains many thousands or even millions of grains 2 lying next to each other in the light absorbing layer. But two particles is the minimum number needed to demonstrate the architecture and the working principle of the solar cell.

The photovoltaic device 30 comprises an insulating layer 20 in the form of a porous insulating substrate, a first conducting layer 16 disposed on one side the insulating layer, a second conducting layer 18 disposed on the opposite side of the insulating layer, and a light absorbing layer 1a disposed on the first conducting layer 16 and in electrical contact with the first conducting layer. The conducting layers 16, 18 are connected to an external electric load 32. The first and second conducting layers 16, 18 are separated physically and electrically by the insulating layer 20. A layer 26 of titanium silicide ($TiSi_2$) is formed between the silicon grains 2 of the light absorbing layer 1a and the titanium conducting particles 24 of the first conducting layer 16. The silicon grains 2 of the light absorbing layer 1a are bonded to the titanium particles. The titanium conducting particles 24 in the first conducting layer 16 are in physical and electrical contact with each other, and the titanium conducting particles 25 in the second conducting layer 18 are in physical and electrical contact with each other.

The titanium particles in the conducting layers 16, 18 are partly covered by insulating layers 28 of insulating titanium oxide ($TiO_2$). The parts of the surfaces of the titanium conducting particles 24, which are in contact with the grains 2 or with the other conducting particles 24 in the layer, are not covered with titanium oxide. A zone 38 between the light absorbing layer 1a and the first conducting layer 16 comprises titanium oxide ($TiO_2$) and silicone oxide ($SiO_2$).

The photovoltaic device 30 differs from the photovoltaic device 10 shown on FIG. 2 in that it comprises a connection site 34 electrically coupled to the second conducting layer 18 and electrically insulated from the first conducting layer. The connection site 34 may comprise a metal layer. In this example, the connection site 34 comprises a layer made of silver (Ag). It is suitable to use silver, since it provides good electrical contact both with titanium and PEDOT. Another advantage with using silver is that silver prevents formation of oxide on the titanium particles 25 of the second conducting layer 18 in the area of contact between the titanium particles and the connection site 34. Instead, a layer 36 of titanium silver (AgTi) is formed between the titanium particles 25 of the second conducting layer 18 and the connection site 34. Thus the PEDOT can form a good low ohmic contact with silver and the silver can form a good low ohmic contact with titanium via the AgTi. Consequently, PEDOT can contact the titanium indirectly via the silver and the AgTi. Other materials may be used in the connection site, for example, carbon based materials such as graphite or amorphous carbon.

The charge conductor 3 is arranged in physical and electrical contact with the grains 2 of the light absorbing layer 1a. The charge conductor 3 is also arranged in electrical contact with the connection site 34, which is electrically coupled to the second conducting layer 18. In this embodiment, the charge conductor 3 is electrically insulated from the first and second conducting layers 16, 18 by means of the insulating layers 28 on the conducting particles 24, 25. The charge conductor 3 covers a main part of the grains 2, and extends through the first conducting layer 16, the insulating layer 20, and the second conducting layer 18, as shown in FIG. 4. The charge conductor 3 is in contact with the oxide layers 28 on the particles in the first and second conducting layers. The charge conductor 3 is electrically insulated from the conducting particles 24, 25, and accordingly from the first and second conducting layers by means of the insulating oxide 28. The charge conductor 3 is in physical and electrical contact with the connection site 34. The charge conductor 3 is indirectly in physical and electrical contact with the titanium particles 25 via the connecting site 34. Thus, the connecting site serves the purpose of making sure that the charge conductor can transfer holes to the titanium particles 25 of the second conducting layer. The photovoltaic device may also comprise a casing or other means for enclosing the photovoltaic device.

In the following, there is a step by step explanation on how the solar cell disclosed in FIG. 4 works:

Step 1. A photon creates an excited electron—hole pair inside the grains 2. In this example, the charge conductor 3 is PEDOT, the grain 2 is made of silicon, and the interface 40 is a PEDOT—silicon interface.

Step 2. The excited electron then travels through the grain 2 and across the zone 26 of metal silicon interface and enters into the conducting particle 24. In this example, the particle 24 is a Ti particle and the layer 26 comprises TiSi2. Thus, the electron passes the Si—TiSi2-Ti interface. The excited hole, on the other hand, travels across the interface 40 into the layer of charge conductor 3.

Step 3. The electron in the conducting particle 24 can then be transferred to neighbouring particles 24 and then be collected in an external electric circuit via an external electric load 32. In the meantime the hole travels inside the charge conducting paths 22 of the charge conductor 3 all the way down to the low ohmic silver layer of the connection site 34.

Step 4. After passing the external electric load 32 the electron is transferred to the second conducting layer 18. The electron is then transferred to the Ti—TiAg—Ag layer 36. The hole in the charge conductor 3 is transferred to the silver layer of the connection site 34 and recombines with the electron in the connection site 34.

Six crucial interfaces can be identified in the example disclosed in FIG. 4:

1. Charge Conductor—Grain Interface

The grains 2 must be essentially oxide free in order to achieve an efficient charge separation of electrons and holes at the interface 40 between the grains 2 and the charge conductor 3 to enable generation of high photocurrent and high photo voltage. The thickness of an oxide layer on the grains should be only a few nanometres thick or even thinner for obtaining efficient charge separation. In this embodiment, the grains tare made of doped silicon, the charge conductor 3 is made of PEDOT, and accordingly the interface 40 is a PEDOT-Si interface. The silicon must be essentially oxide free, i.e. no or very little SiO2 on the Si surface in order to achieve an efficient charge separation of electrons and holes at the PEDOT-Si interface.

2. Conducting Particle—Grains

A layer 26 of metal silicide is formed between the grains 2 and the conducting particles 24 of the first conducting layer. The metal silicide should be of sufficiently high conductivity to minimize resistive losses when electrons are transferred from the grains to the conducting particles. In this embodiment, the conducting particles are made of titanium (Ti), and accordingly the layer 26 between the silicon grains and the titanium particles consists of titanium silicide (TiSi2).

3. Charge Conductor—Metal Silicide—Oxide

To avoid short circuit, there should be an insulating layer 38 between the charge conductor 3, the metal silicide layer 26, and the insulating oxide layer 28. In this embodiment, the insulating layer 38 consists of titanium oxide (TiO2) and silicon oxide (SiO2). The TiO2-SiO2 layer 38 must be sufficiently thick to achieve good electrical insulation between PEDOT and TiSi2. If the TiO2-SiO2 layer 38 is too thin there will be short circuit between PEDOT and TiSi2 with lowered photocurrent and photo voltage as consequence.

4. Charge Conductor—Conducting Particles

In order to achieve insulation between the charge conductor 3 and the conducting particles 24, 25 of the first and second conducting layers, the conducting particles is covered with an insulating oxide layer 28. In this embodiment, the insulating oxide layer 28 consists of titanium oxide, such as TiO2. The titanium oxide layer 28 must be sufficiently thick in order to achieve sufficient electrical insulation between the PEDOT and the titanium. If the titanium oxide layer is too thin, the photo voltage and the photocurrent will be lowered because of short-circuit between PEDOT and titanium.

5. Connection Site—Conducting Particles

Between the conducting particles 25 of the second conducting layer and the connection site 34, there is a conducting a layer 36. In this embodiment, the conducting layer 36 consists of titanium silver (TiAg). The conducting layer 36 must be thick enough to provide a good low ohmic electric contact between the conducting particles 25 of the second conducting layer and the connection site 34, e.g. between the silver (Ag) and the titanium (Ti).

6. Connection Site—Charge Conductor

The charge conductor 3 is in contact with the connection site 34 at an interface 42. The charge conductor 3, in this embodiment PEDOT, should cover the silver of connection site 34 sufficiently to avoid resistive losses in order to achieve maximum photocurrent.

In the following, an example of a method for manufacturing a photovoltaic device according to the invention will be described.

Step 1: Forming a first porous conducting layer on one side of a porous insulating substrate. This is, for example, done by printing with an ink including conductive particles on one side of the porous insulating substrate. The porous insulating substrate is, for example, a porous glass microfiber based substrate.

For example, a first ink is prepared by mixing 10 um sized TiH$_2$ particles with terpineol. The ink comprises TiH$_2$ particles with a diameter that is smaller than 10 micrometres. Subsequently, the first ink is printed onto a porous glass microfiber based substrate. The printed layer will form a first porous conducting layer. Suitably, the conductive particles are too large to be able to penetrate through the porous insulating substrate.

Step 2: Forming a second porous conducting layer on an opposite side of the porous insulating substrate. This is, for example, done by printing with an ink including conductive particles on the opposite side of the porous insulating substrate. Suitably, the conductive particles are too large to be able to penetrate through the porous insulating substrate.

For example, a second ink is prepared by mixing TiH$_2$ with terpineol. The ink comprises TiH$_2$ particles with a diameter that is smaller than 10 micrometres. The filtered ink is then mixed with silver plated conductive particles in order to make an ink for depositing the second conducting layer. Subsequently, the second ink is printed onto the opposite side of the porous insulating substrate. The second printed layer will form a second conducting layer.

Step 3: Coating the first porous conducting layer with a layer of grains made of a doped semiconducting material to form a light absorbing layer. This is, for example, done by printing with an ink including a powder of grains of a doped semiconducting material, such as doped silicon, on the first conducting layer. Alternatively, powder of grains of a doped semiconducting material, such as doped silicon, can be sprayed on the first conducting layer. Suitable spraying techniques are, for example, electro spraying or electrostatic spraying. The silicon particles may be etched in a separate step before deposition on the first conducting layer. The etching of the silicon particles can be performed using, e.g. isotropic etching solutions or anisotropic etching solutions. The isotropic etching of the silicon particles can be used to remove impurities from the silicon surface. Anisotropic etching of the silicon particles can be used for a pyramid shaped etch pit where the pyramid shaped silicon surface can increase the effective light absorption by the silicon.

Step 4: Applying a pressure on the layer of grains so that portions of the grains project into the first porous conducting layer. For example, pressure can be applied on top of the grains by using a membrane press or by using a roller press. Step 4 is optional.

Step 5: Heat treating the solar cell under vacuum until the grains have been sintered to the first porous conducting layer. The layer of grains and the porous conducting layers are vacuum sintered to form a porous layer of grains on the first conducting layer. During the sintering, the grains bond to the conducting particles of the first conducting layer to achieve mechanical and electrical contact between them. Also, during vacuum sintering the conducting particles are sintered together to form a first conducting layer with mechanical and electrical contact between the conducting particles. Preferably, the assembly of substrate, first and second conducting layer and grains is heat treated in vacuum with a temperature above 550° C. during at least two hours. For example, the printed substrate is vacuum sintered at 650° C. and then allowed to cool down to room temperature. The pressure during sintering is lower than 0.0001 mbar. During the heat treating in vacuum, the silicon of the grains and the titanium of the particles are reacting and form titanium silicide in the boundaries between the grains and the particles. Thus, layers of titanium silicide are formed between the grains and the particles of the first conducting layer, which improve the electrical contact between the grains and the particles.

Step 6: Heat treating the solar cell in air until the available surface of first porous conducting layer has been oxidized. In a next step, the solar cell is heat treated in air to achieve an electrically insulating oxide layer on the conducting particles of the first and second conducting layer. The surface of the silicon particles becomes oxidized during the heat treatment in air.

Step 7: Removing the silicon oxide layer on the silicon particles. In a next step the silicon oxide on the silicon particles is removed by treating the surface of the silicon particles with hydrogen fluoride. The surface of the silicon particles can be exposed to hydrogen fluoride in the form of a solution of HF in water. Alternatively the HF treatment of the silicon particles can be performed by exposing the surface of the silicon particles to gaseous HF. The HF treatment has the effect of removing silicon oxide from the surface of the silicon particles.

Step 8: Deposition of PEDOT:PSS. In a next step PEDOT:PSS is deposited onto the surface of the silicon particles and inside pores of the first conducting layer and inside the pores of the insulating substrate and inside the pores of the second conducting layer. The PEDOT:PSS can be deposited from, e.g., a water based solution containing PEDOT:PSS. The PEDOT:PSS solution can be deposited by soaking the substrate with the first and second conducing layer and the silicon grains in a solution of PEDOT:PSS. Alternatively the PEDOT:PSS deposition can be performed in several steps.

For example, the PEDOT:PSS solution can first be sprayed onto the silicon grains followed by drying off the solvent to yield a dry solid PEDOT:PSS layer on the surface of the silicon grains. In a second step the second conducting layer is sprayed with a solution of PEDOT:PSS A suitable spraying technique to achieve a thin layer of PEDOT:PSS on the silicon grains is, e.g., ultrasonic spraying.

The photovoltaic device according to the invention comprises grains of semiconducting particles and therefore manufacturing and handling of wafers or build-up of thin films of brittle material is avoided. The grains as such is a cheaper material and easier to handle in an industrial production. The grains can easily be applied by printing or similar methods. A possible defect on the surface of grains will only have local influence on the efficiency of the cell. Accordingly, this photovoltaic device is cheaper than the prior art photovoltaic devices. An environmentally friendly and stable material with high conversion efficiency, such as silicon, can be used as the grains in the light absorbing layer. The photovoltaic device according to the invention can be made thin and flexible.

Figure 5:
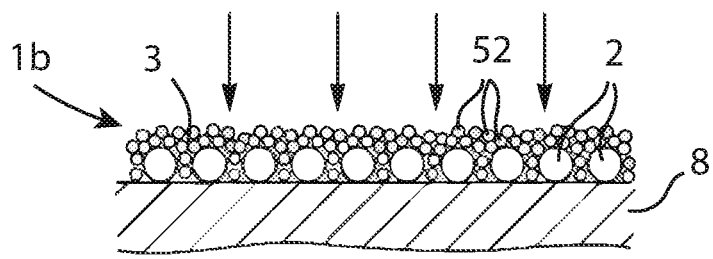
FIG. 5 shows an example of a light absorbing layer according to a second embodiment of the invention.

FIG. 5 shows an example of a light absorbing layer 1b according to a second embodiment of the invention. The light absorbing layer 1b comprises a plurality of grains 2 made of a semiconducting material of a first type of doping, and a charge conductor 3 comprising a plurality of particles 52 made of a semiconducting material of a second type of doping. The average size of the semi-conducting particles 52 is smaller than the average size of the grains 2 to allow the semi-conducting particles to be accommodated in spaces formed between the grains 2. For example, the average size of the grains 2 is less than 1 mm, and the average size of the semi-conducting particles 52 is preferably less than 0.1 mm to allow them to accommodate in the space formed between the grains 2.

Suitably, the semiconducting material of the grains 2 and the particles 52 is silicon, and the grains 2 and the particles 52 are made of silicon with different types of doping. However, other semiconducting material can also be used. For example, the grains 2 can be made of CdTe, CIGS, CIS or GaAs, and the semiconducting particles 52 can be made of CuSCN or CuI.

The grains 2 and the particles 52 are in physical and electrical contact with each other so that a plurality of junctions is formed in a contact area between them. The type of the doping of the grains 2 and the semiconducting particles 52 are such that the junctions can provide separation of photo-excited electrons and holes. Due to the different types of doping of the grains 2 and the semiconducting particles 52, a "depletion region" is created in the area where the grains 2 and the semiconducting particles 52 are in contact with each other. When the electron-hole pairs reach the "depletion region", the electron and the hole are separated. The first and second type of doping is, for example, of P-type and N-type, and by that the junctions are PN-junctions, or possible PIN-junctions.

Figure 6:
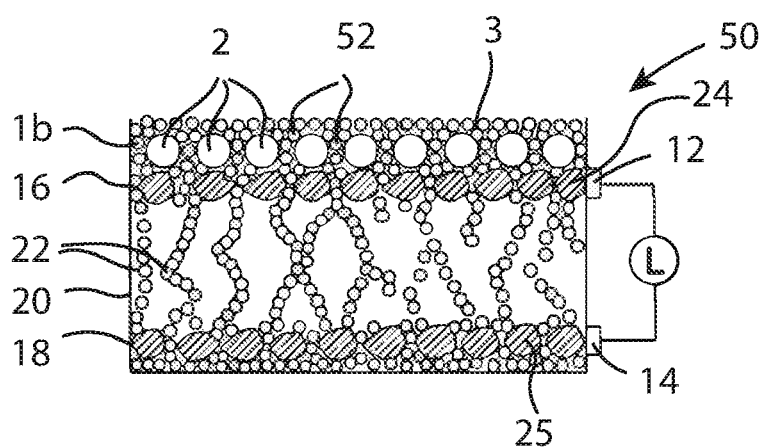
FIG. 6 shows schematically a cross-section though a photovoltaic device according to a third embodiment of the invention.

FIG. 6 shows schematically a cross-section though a photovoltaic device 50 according to a third embodiment of the invention including the light absorbing layer 1b comprising the grains 2 and the charge conductor 3, as shown in FIG. 5. The photovoltaic device 50 further comprises a first conducting layer 16 including conducting particles 24 in electrical contact with the grains 2, a second conducting layer 18 including conducting particles 25 electrically coupled to the semiconducting particles 52 of the charge conductor 3, and an insulating layer 20 disposed between the first and second conducting layers. The photovoltaic device 50 further comprises a first contact 12 electrically connected to the first conducting layer and a second contact 14 electrically connected to the second conducting layer.

The device 50 further comprises a plurality of charge conducting paths 22 of a charge conducting material disposed between the light absorbing layer 1b and the second conducting layer 18. In this embodiment, the charge conducting paths 22 comprise a plurality of semiconducting particles made of a charge conducting material. For example, the semiconducting particles in the paths 22 are made of doped silicon. Suitably, the semiconducting particles in the path are made of the same material as the semiconducting particles 52 in the light absorbing layer. The charge conductor 3 is deposited in such a way that some of the semi-conducting particles 52 partly cover the grains 2 and some of the semi-conducting particles 52 form a plurality of continuous paths 22 of charge conducting material from the surface of the grains 2 to the second conducting layer. Suitably, the first and second conducting layers, and the insulating layer 20 are porous to allow the semiconducting particles 52 of the charge conductor 3 to penetrate through the conducting layers and the insulating layer. The semi-conducting particles 52 of the charge conductor 3 are accommodated in pores of the first and second conducting layers and in pores of the insulating layer 20, as shown in FIG. 6. The semi-conducting particles 52 of the charge conductor are in electrical contact with each other, and in electrical contact with the grains 2 in the light absorbing layer so that at least some of the semi-conducting particles 52 form a semi-conducting network between the light absorbing layer 1b and the second conducting layer.

The present invention is not limited to the embodiments disclosed but may be varied and modified within the scope of the following claims. For example, in an alternative embodiment the grains can be embedded in the charge conductor. The architecture of the photovoltaic device may also vary. For example, the insulating layer and/or the second conducting layer can be omitted in other embodiments. The light absorbing layer according to the invention can also be used in a front contact photovoltaic device where a metal anode grid is positioned on top of the light absorbing layer, i.e. on the charge conductor and the grains. Additionally, the second conducting layer could be non-porous in the form of a metal film.

The invention claimed is:

1. A photovoltaic device (10; 30; 50) comprising:
a first conducting layer (16),
a light absorbing layer (1a, 1b) comprising a first light-incident surface and a second opposing surface which is disposed on the first conducting layer (16), wherein the light absorbing layer comprises a plurality of grains (2) of a doped semiconducting material,
the semiconducting material of the grains (2) is one or more of the following semiconducting materials: silicon, CdTe, CIGS, CIS, GaAs, and perovskite, and
the average size of the grains (2) is between 1 μm and 300 μm,
a charge conductor (3) made of a solid charge conducting material in physical contact with the grains and disposed on the grains (2) and between the grains (2) so that a plurality of junctions (4) is formed between the grains (2) and the charge conductor (3), and
a second conducting layer (18) electrically insulated from the first conducting layer (16), wherein the charge conductor (3) is electrically coupled to the second conducting layer (18), and a portion of the surface of each of the grains (2) is in physical and electrical contact with the first conducting layer (16) and the predominant part of the remaining free surface of each of the grains is covered with the charge conductor, wherein the device comprises an insulating layer (20) arranged between the first and second conducting layers (16, 18), and the first conducting layer (16), the second conducting layer (18) and the insulating layer (20) are positioned under the second surface of the light absorbing layer (1*a*, 1*b*).

2. The photovoltaic device according to claim 1, wherein the charge conductor (3) is deposited in such a way that it forms a plurality of continuous paths (22) of charge conducting material from the surface of the grains (2) to the second conducting layer (18).

3. The photovoltaic device according to claim 2, wherein the charge conductor (3) penetrates through the first conducting layer (16) and the insulating layer (20) to form said paths (22).

4. The photovoltaic device according to claim 2, wherein the first conducting layer (16) and the insulating layer (20) are porous, and the charge conductor (3) is accommodated in pores of the first conducting layer (16), and in pores of the insulating layer, so that the conducting paths are formed through the first conducting layer (16) and the insulating layer (20).

5. The photovoltaic device according to claim 1, wherein said first conducting layer (16) comprises an insulating oxide arranged to electrically insulate the charge conductor (3) from the first conducting layer (16).

6. The photovoltaic device according to claim 1, wherein the first conducting layer (16) comprises sintered metal particles (24) in electrical contact with the grains (2).

7. The photovoltaic device according to claim 1, wherein said grains (2) are made of doped silicon, and the first conducting layer (16) comprises metal or a metal alloy, and a zone of physical contact between the grains (2) and the first conducting layer (16) is a layer (26) of metal silicide or a metal-silicon alloy.

8. The photovoltaic device according to claim 1, wherein the charge conductor (3) is disposed on the grains (2) and between the grains (2) so that most of the grains are covered with a layer (6) of the charge conductor covering at least 50% of the surface of the grains.

9. The photovoltaic device according to claim 1, wherein said grains (2) are made of doped silicon.

10. The photovoltaic device according to claim 9, wherein said grains (2) predominantly have (111) planes exposed at the surface of the grains.

* * * * *